US009041121B2

(12) United States Patent
Depetro et al.

(10) Patent No.: US 9,041,121 B2
(45) Date of Patent: May 26, 2015

(54) INTEGRATED VOLTAGE DIVIDER

(75) Inventors: Riccardo Depetro, Domodossola (IT); Aldo Vittorio Novelli, St. Lorenzo Parabiago (IT); Ignazio Salvatore Bellomo, Rozzano (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 61 days.

(21) Appl. No.: 13/615,220

(22) Filed: Sep. 13, 2012

(65) Prior Publication Data

US 2013/0070429 A1    Mar. 21, 2013

(30) Foreign Application Priority Data

Sep. 15, 2011    (IT) ................ VI2011A0247

(51) Int. Cl.
| H01L 27/06 | (2006.01) |
| H01K 1/18 | (2006.01) |
| H01L 29/78 | (2006.01) |
| H01L 29/861 | (2006.01) |
| H01L 49/02 | (2006.01) |
| H01L 29/06 | (2006.01) |

(52) U.S. Cl.
CPC ........ *H01L 29/7817* (2013.01); *H01L 29/7818* (2013.01); *H01L 29/861* (2013.01); *H01L 28/20* (2013.01); *H01L 29/0692* (2013.01); *H01L 29/0696* (2013.01)

(58) Field of Classification Search
CPC ................. H01L 29/7817; H01L 29/7818
USPC ....................................................... 257/380
See application file for complete search history.

(56) References Cited

U.S. PATENT DOCUMENTS

| 5,315,139 A * | 5/1994 | Endo ......................... 257/409 |
| 2010/0022064 A1 | 1/2010 | Hall |
| 2010/0314710 A1 | 12/2010 | Yamaji |

FOREIGN PATENT DOCUMENTS

| EP | 0576001 A1 | 12/1993 |
| EP | 1032046 A1 | 8/2000 |

OTHER PUBLICATIONS

Italian Search Report and Written Opinion dated Jul. 4, 2012 from corresponding Italian Application No. VI2011A000247.

* cited by examiner

*Primary Examiner* — Robert Carpenter
(74) *Attorney, Agent, or Firm* — Gardere Wynne Sewell LLP

(57) ABSTRACT

A semiconductor structure including a high-voltage transistor; voltage dropping circuitry, at least part of which is overlapping the high-voltage transistor; at least one intermediate contact point to the voltage dropping circuitry, connected to at least one intermediate position between a first and a second end of the voltage dropping circuitry; and at least one external connection connecting the at least one intermediate contact point to outside of the semiconductor structure.

18 Claims, 6 Drawing Sheets

INTEGRATED VOLTAGE DIVIDER

CROSS REFERENCE TO RELATED APPLICATIONS

This application claims the priority benefit of Italian patent application number VI2011A000247, filed on Sep. 15, 2011, which is hereby incorporated by reference to the maximum extent allowable by law.

BACKGROUND

1. Technical Field

The present disclosure relates to a semiconductor structure comprising a high-voltage transistor; voltage dropping means, at least part of which is overlapping the high-voltage transistor; at least one intermediate contact point to the voltage dropping means, connected to at least one intermediate position between a first and a second end of the voltage dropping means.

2. Discussion of the Related Art

In recent years, the requirement for smaller electronic devices has forced manufacturers of such devices to integrate more and more components within printed semiconductor chips.

Additionally, it is common to have high voltages, in the range of 300 to 500 volts, or even higher, on a printed circuit board of such devices.

For instance, in the case of AC/DC power conversion, very complex circuit architecture are required so as to reduce power consumption and achieve high efficiency in order to meet market requests. Accordingly, in such cases, the usage of integrated semiconductor chips guarantees a high level of reliability and a cost effective solution.

However, in some applications, such as Power Factor Corrector, it is necessary to reduce the value of the high voltage, or to generate a low voltage reference correlated with the high voltage value, so as to provide one of the components on the printed circuit board with a lower voltage and proper functionality. Usually, such designs are achieved by placing a resistor divider on the board.

For instance, as can be seen in FIG. 6, a circuit board 6000 includes a first semiconductor chip 6001 and a second semiconductor chip 6002. Both first 6001 and second 6002 semiconductor chips are powered by a high voltage terminal 6003 and are connected to a ground terminal 6004. First semiconductor chip 6001 includes a semiconductor structure 4000 comprising at least one high voltage transistor.

Second semiconductor chip 6002 necessitates a voltage lower than the high voltage potential at high voltage terminal 6003 in order to operate. In order to provide the second semiconductor chip 6002 with such a lower voltage, a resistor bridge is provided on circuit board 6000 by resistors 6005 and 6006.

Such a design is nevertheless expensive since it requires the addition of resistors 6005 and 6006 on the board. Moreover, the presence of the resistors 6005 and 6006 on the board requires a larger board area, which may not always be available in modern electronic devices. Furthermore, the presence of resistors 6005 and 6006 on the board requires additional manufacturing steps, thereby also increasing costs and lowering manufacturing yield.

Thus there is a need in the market for a compact solution to provide intermediate voltage levels from a high voltage available on a printed circuit board.

SUMMARY

More specifically, embodiments relate to a semiconductor structure comprising a high-voltage transistor; voltage dropping means, at least part of which is overlapping the high-voltage transistor; at least one intermediate contact point to the voltage dropping means, connected to at least one intermediate position between a first and a second end of the voltage dropping means; and at least one external connection connecting the at least one intermediate contact point to outside of the semiconductor structure.

Thanks to such approach, it is possible to use the semiconductor structure as a voltage divider.

In some embodiments, the voltage dropping means can comprise a spirally shaped first voltage dropping element.

Thanks to such approach, it is possible to effectively use the space above high voltage transistor.

In some embodiments, the voltage dropping means can further comprise a spirally shaped second voltage dropping element, spiralling concentrically with the first voltage dropping element.

Thanks to such approach, it is possible to effectively use the space above high voltage transistor and to obtain different voltage and/or current values from the two voltage dropping means.

In some embodiments, any of the first and/or second voltage dropping elements can have a transversal section having a constant value or having a value compensating for the different length of each of the spires.

Thanks to such approach, flexibility in the design of the amount of voltage drop at precise locations of the voltage dropping means can be achieved.

In some embodiments, the first end and/or second end of the voltage dropping means can be connected to the drain and the source and/or the gate and/or the body of the high-voltage transistor.

Thanks to such approach, it is possible to place the voltage dropping means directly above the high voltage transistor and to efficiently use the space above the high voltage transistor.

In some embodiments, the drain and/or the source and/or the gate and/or the body of the high-voltage transistor can be connected to the at least one intermediate contact point.

Thanks to such approach, it is possible to drive the drain and/or the source and/or the gate and/or the body of the high voltage transistor with a desired voltage level.

In some embodiments, the voltage dropping means comprises at least one resistor.

Thanks to such approach, the voltage dropping means can achieve a simple operation and can operate quickly both in the charge and the discharge of the at least one intermediate point.

In some embodiments, the at least one resistor can comprise polysilicon and/or polysilicon doped with any of phosphorus and/or boron and/or arsenic Thanks to such approach is it possible to realize the resistor in a manner compatible with standard semiconductor processes.

In some embodiments, the at least one resistor can have a resistance in the range of 10 k$\Omega$-1 G$\Omega$, preferably 100 M$\Omega$.

Thanks to such approach, it is possible to provide an appropriate current and/voltage value to the at least one intermediate point.

In some embodiments, the voltage dropping means can comprise at least one series of diodes.

Thanks to such approach, the current flowing through the voltage dropping means can be reduced.

In some embodiments, the at least one series of diodes can comprise a plurality of reverse-biased diodes.

Thanks to such approach, the number of diodes can be reduced and/or the diodes current capacity can be increased.

In some embodiments, the at least one series of diodes can comprise a plurality of back-to-back diodes.

Thanks to such approach, the at least one series of diodes can be realized with a series of symmetrically doped regions.

In some embodiments, the voltage dropping means can overlap a drift region of the high-voltage transistor.

Thanks to such approach, the size of the semiconductor structure can be reduced.

In some embodiments, the voltage dropping means and the high-voltage transistor can be separated by an insulation layer.

Thanks to such approach, it is possible to safely insulate the voltage dropping means from the high voltage transistor, so as to avoid any voltage breakdown.

Moreover, the embodiments can relate to a circuit board comprising the semiconductor structure and a second semiconductor chip, wherein the circuit board is configured so that at least the second semiconductor chip uses the semiconductor structure as a voltage divider.

Thanks to such approach, it is not necessary to realize an additional voltage divider on the board.

BRIEF DESCRIPTION OF THE DRAWINGS

Embodiments will be described in more detail by way of example hereinafter using advantageous embodiments and with reference to the drawings. The described embodiments are only example configurations in which the individual features may however, as described above, be implemented independently of each other or may be omitted. Equal elements illustrated in the drawings are provided with equal reference signs. Parts of the description relating to the same or similar elements illustrated in the different drawings may be left out. In the drawings.

DETAILED DESCRIPTION

Figure 4A:
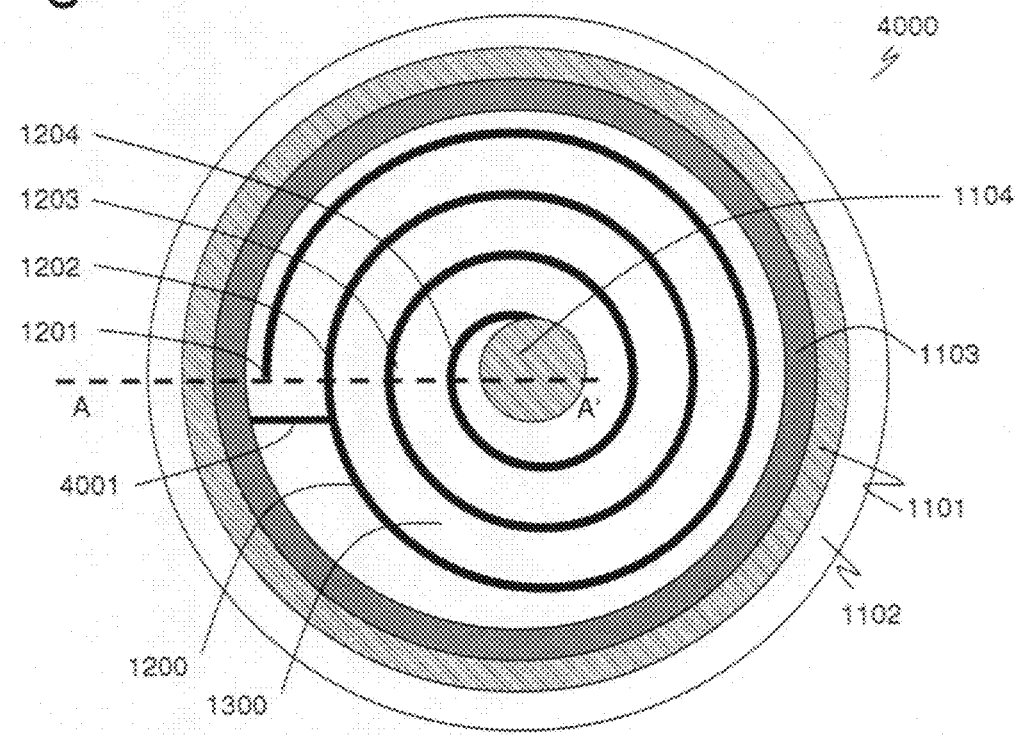
FIGS. 4a, 4b, 5a and 5b are schematic views of a semiconductor structure.
Figure 4B:
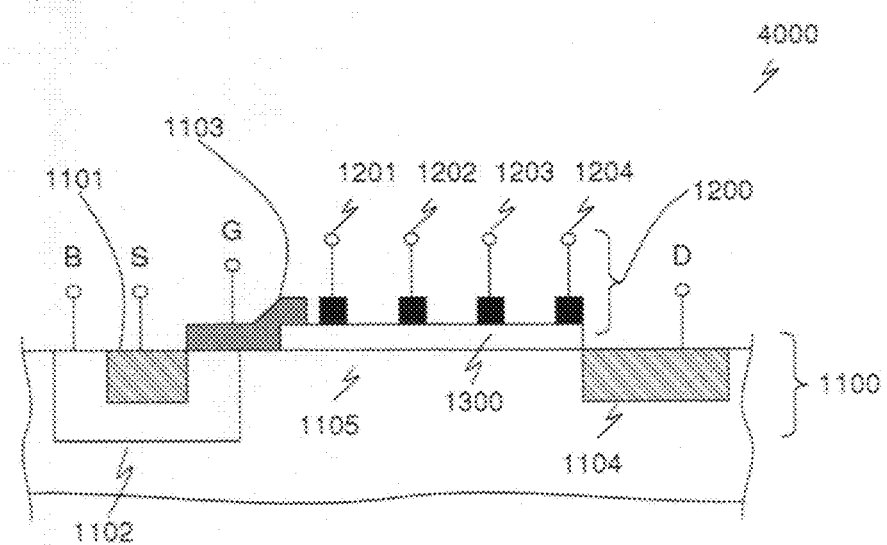
Figure 6:
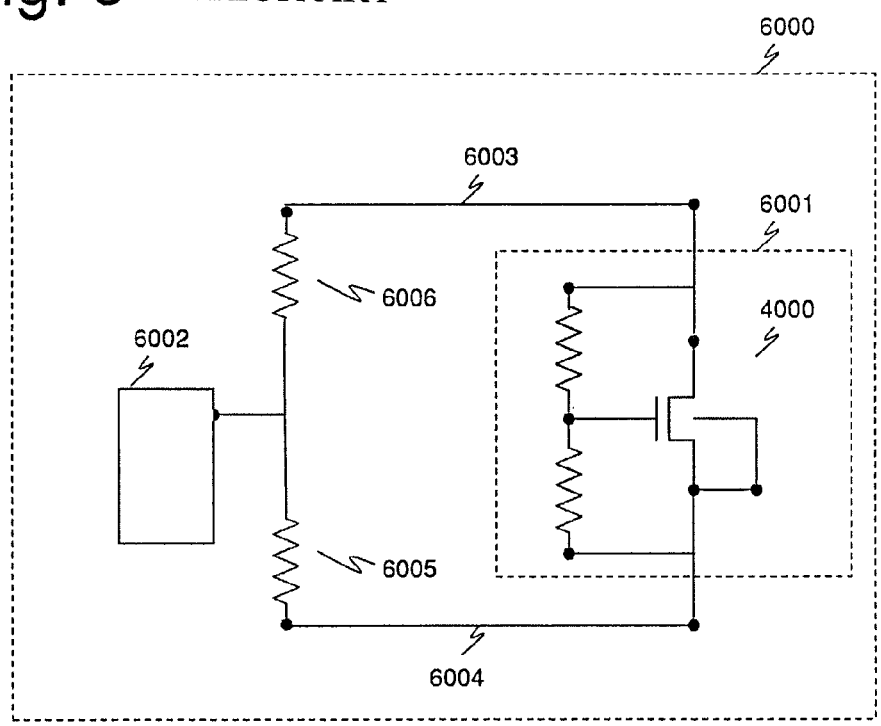
FIG. 6 is a schematic view of a circuit board.

FIG. 4a illustrates a top view of semiconductor structure 4000 contained within first semiconductor chip 6001 of circuit 6000 board of FIG. 6. FIG. 4b illustrates a section of semiconductor structure 4000 of FIG. 4a taken along line A-A'.

As can be seen in FIGS. 4a and 4b, semiconductor structure 4000 comprises a high voltage transistor 1100 and voltage dropping element 1200. More specifically, the high voltage transistor 1100 comprises a source 1101, a body 1102, a gate 1103, a drain 1104 and a drift region 1105. In the case, for instance, of an N-MOS high voltage transistor 1100, the drain 1104 is N+ doped, so as the source 1101. At the same time, the body 1102 is P doped while the drift region 1105 is N doped. With such an arrangement, a current can flow from the drain 1104 to the source 1101 depending on the voltage applied to the gate 1103, by using the drift region 1105 as a resistor.

The dopants for the P doped regions could be any of Boron and/or Indium in a concentration of 1e16-1e18 cm-3, preferably 1e17 cm-3. The dopants for the N doped region could be any of Boron or indium in a concentration of 1e16-1e18 cm-3, preferably 1e17 cm-3.

The high voltage transistor 1100 could have a radius, extending from the center of drain 1104, to the limit of body 1101, in the range of 50-500 um, preferably 100 um.

It is possible to connect the drain 1104 to the high voltage terminal 6003 of circuit board 6000 and connect the source 1101 and body 1102 to the ground terminal 6004. In such a manner, it is possible to make a current flow or not through high voltage transistor 1100 depending on the value of the control voltage applied to gate 1103. Due to the very high value of the high voltage terminal 6003, it may not be possible to directly connect the high voltage terminal 6003 to the gate 1103. In this case, a connection to the gate within a midpoint of voltage dropping element 1200 can be provided.

As can be seen in FIG. 4a, voltage dropping element 1200 can be arranged in a spiral fashion spiraling from drain 1104 towards gate 1103. Moreover, as can be seen in FIG. 4b, voltage dropping element 1200 is disposed on top of an insulation layer 1300 separating dropping element 1200 from the drift region 1105. Insulation layer 1300 could be realized with silicon dioxide, or silicon nitride or a stack of the two films having a thickness in the range of 200-3000 nm, preferably 700 nm. This provides an efficient manner of avoiding a voltage breakdown.

By connecting, to the drain 1104, the end of the voltage dropping element 1200 closer to the drain 1104 and by connecting, to the source 1102, the end of the voltage dropping element 1200, it is possible to have a current flowing through the voltage dropping element 1200.

The voltage dropping element 1200 could be, for instance, one or more resistors, or a series of reverse-polarized diodes, or a series of back-to-back diodes. In general, any configuration which provides a manner for dropping the voltage from the value of the high voltage terminal 6003 to the value of the ground terminal 6004, can be employed.

In such a manner, voltage dropping element 1200 acts as a voltage dropping means. By choosing an appropriate configuration for the voltage dropping element 1200, the current flowing through voltage dropping element 1200 can be made of a value, which is acceptable for the board design. For instance, using a series of reverse-polarized diodes, or a series of back-to-back diodes could be advantageous.

When using one or more resistors for realizing voltage dropping element 1200, a resistance value could be in the range of 10 k$\Omega$-1 G$\Omega$, preferably 1 M$\Omega$-500 M$\Omega$, even more preferably 100 M$\Omega$. In order to obtain such a value, the resistor could have a length in the range of 10-100 mm, preferably 50 mm, a thickness in the range of 0.1 um-1 um preferably 0.3 um, and a width in the range of 0.1-5 um, preferably 0.8 um.

The material for realizing such a resistor could be any of polysilicon possibly doped with any of phosphorus, boron, arsenic in a concentration of 1e16-1e19 cm-3, preferably 1e17 cm-3.

When using a series of back-to-back connected diodes for realizing voltage dropping element 1200, the number of diodes could be in the range of 100-2000, preferably 500. In order to obtain such number of diodes, voltage dropping element 1200 could have a length in the range of 10-100 mm, preferably 50 mm, a thickness in the range of 0.1 um-1 um, preferably 0.3 um, and a width in the range of 0.1-5 um, preferably 0.8 um.

The material for realizing such diodes could be any of polysilicon , possibly doped with any of phosphorus, boron, arsenic in a concentration of 1e16-1e19 cm-3, preferably 1e17 cm-3.

Additionally, by connecting the gate 1103 to any intermediate point of the voltage dropping element 1200, a lower control voltage for the gate 1103 being lower than the voltage available at the high voltage terminal 6003 can be obtained.

Figure 5A:
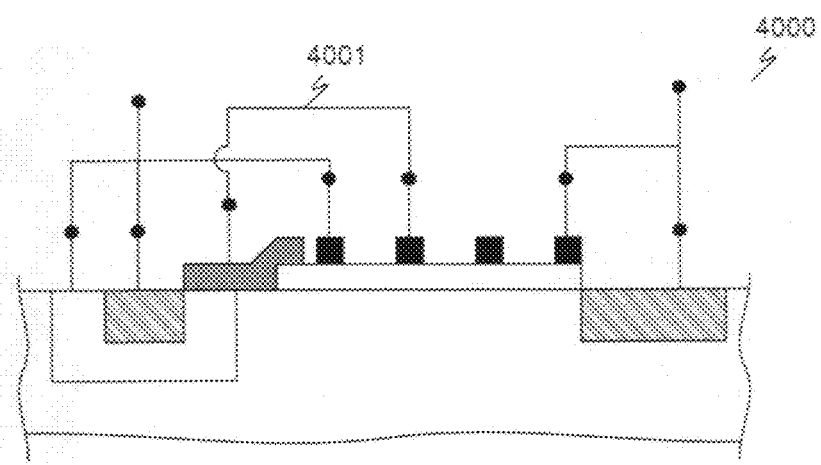
Figure 5B:
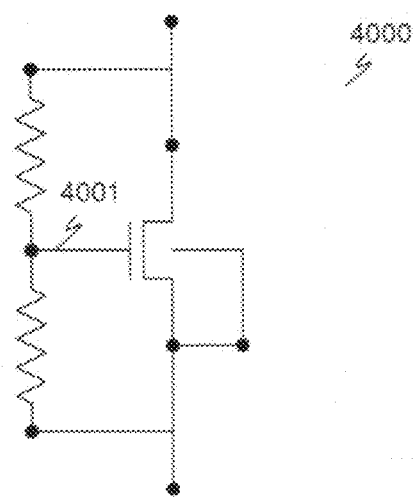

For instance, as can be seen in FIG. 5a, assuming that end points 1204 and 1201 of the voltage dropping element 1200 are respectively connected to the drain 1104 and to the source 1101, the gate 1103 could be connected to any intermediate point of the voltage dropping element 1200 so as to provide gate 1103 with an appropriate voltage value. For instance, as can be seen in FIG. 5a, a connection 4001 could be realized between intermediate point 1202 of the voltage dropping element 1200 and the gate 1103. Such a situation is schematically illustrated in FIG. 5b, assuming that the voltage dropping element 1200 is a resistor.

A semiconductor structure, chip and circuit board will now be described with reference to FIGS. 1a, to 2b.

Figure 1A:
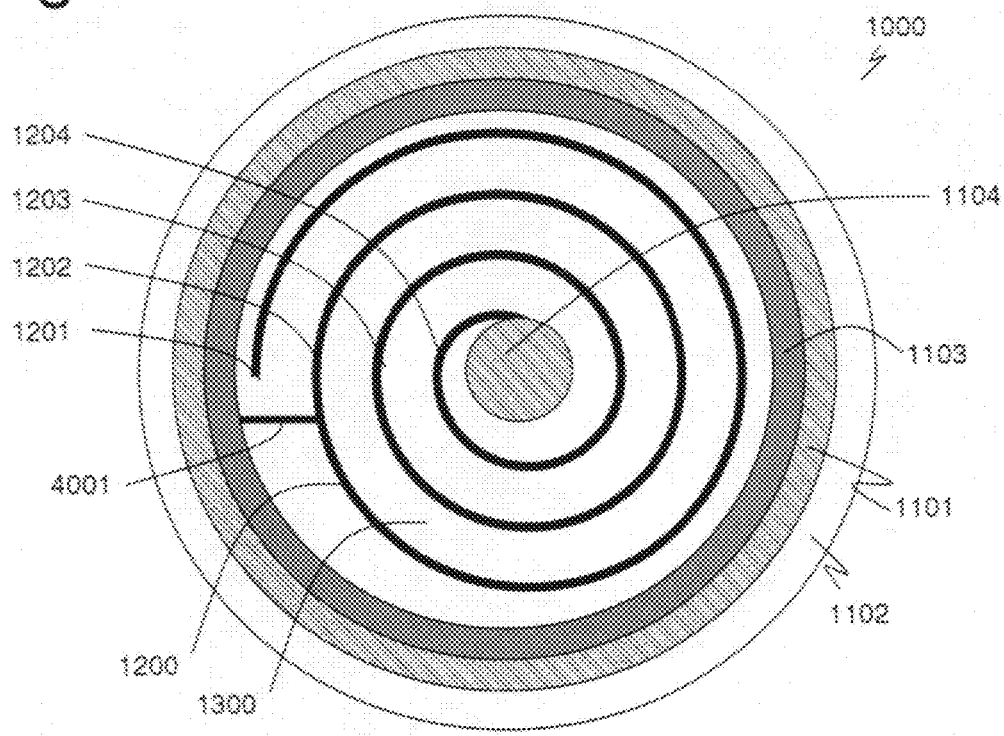
FIGS. 1a, 1b and 2a are schematic views of a semiconductor structure in accordance with an embodiment.
Figure 1B:
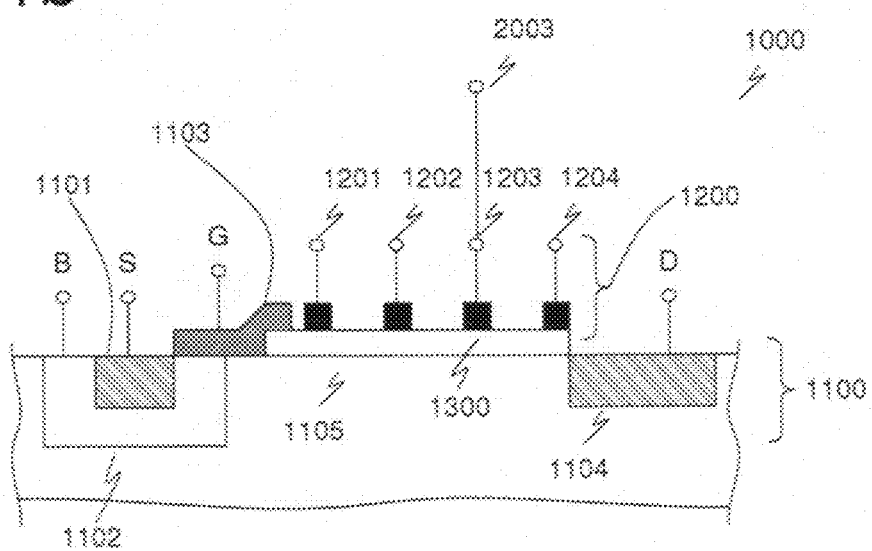

As can be seen in FIGS. 1a and 1b, a semiconductor structure 1000 substantially corresponds to semiconductor 4000 of FIGS. 4a and 4b with the addition of external connection 2003 to intermediate point 1203 of voltage dropping element 1200.

More specifically, external connection 2003, connected to intermediate point 1203 is configured so that it can be connected externally of the semiconductor structure 1000, for instance, to components placed on a circuit board 2000 outside of first semiconductor chip 2001 comprising semiconductor structure 1000.

Such an external connection can be realized, for instance, by a metal line to a bump connected to the external part of the chip package. More generally, any technique allowing the connection of the intermediate point 1203 to second semiconductor chip 6002 via external connection 2003 can be used.

Figure 2A:
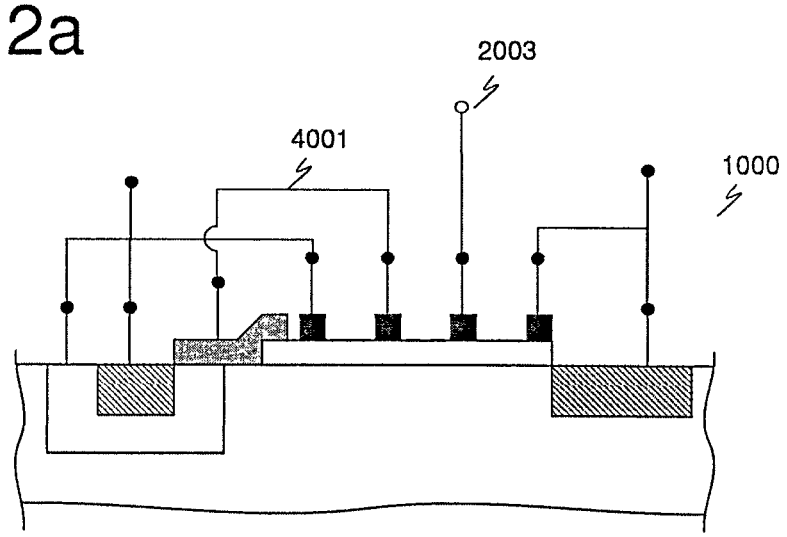
Figure 2B:
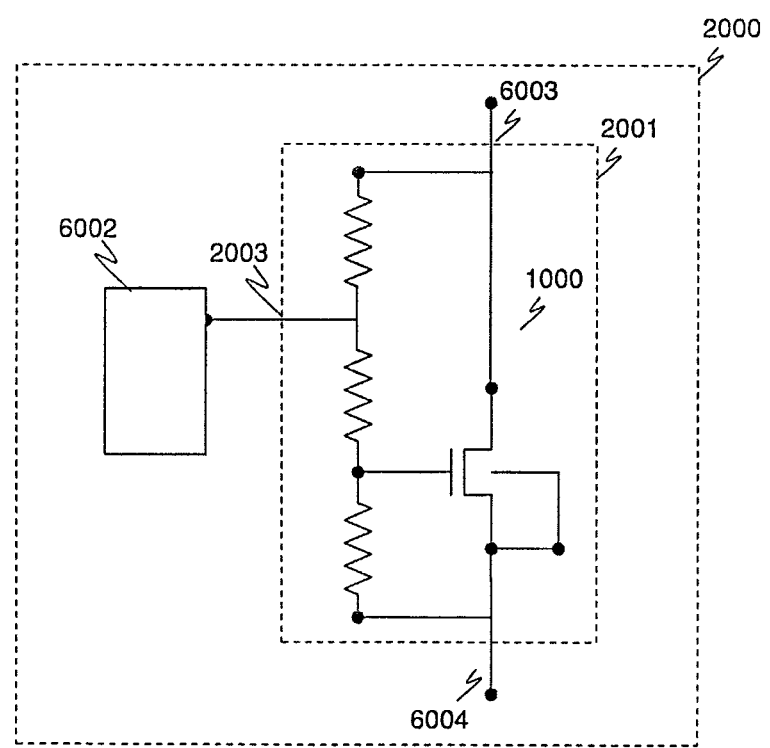
FIG. 2b is a schematic view of a circuit board.

Thanks to such an external connection 2003, it is possible to realize a semiconductor chip 2001 as illustrated in FIG. 2b.

More specifically, first semiconductor chip 2001 differs from first semiconductor chip 6001 of FIG. 6 due to the presence of external connection 2003. In such a manner, second semiconductor chip 6002 can obtain a lower voltage for its operation directly from first semiconductor chip 2001, including semiconductor structure 1000, without the need of additional resistors 6005 and 6006.

This solution is advantageous since the voltage dropping element 1200 is already available within semiconductor chip 2001 containing semiconductor structure 1000, due to the presence of the high voltage transistor 1100.

Moreover, the solution is flexible since the external connection 2003 can be connected to any intermediate point of voltage dropping element 1200 such as, for instance, intermediate point 1202, 1203, or any other point between end points 1201 and 1204 of voltage dropping element 1200.

In such a manner, by using the voltage dropping element 1200, integrated within first semiconductor chip 2001 containing high voltage transistor 1100, the requirement for additional resistors 6005 and 6006 placed on board 6000 is unnecessary.

Figure 3A:
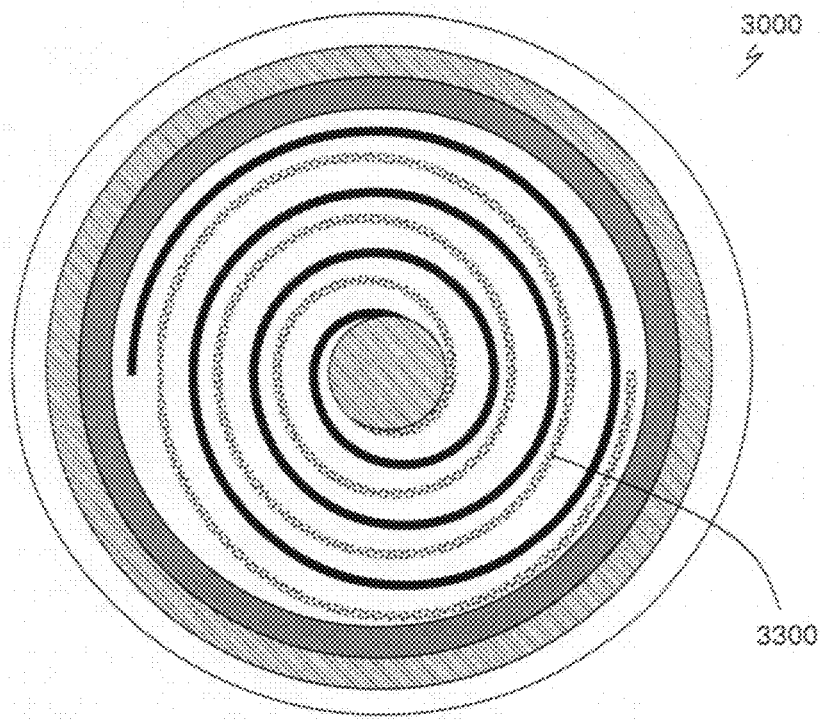
FIGS. 3a and 3b are schematic views of a semiconductor structure.
Figure 3B:
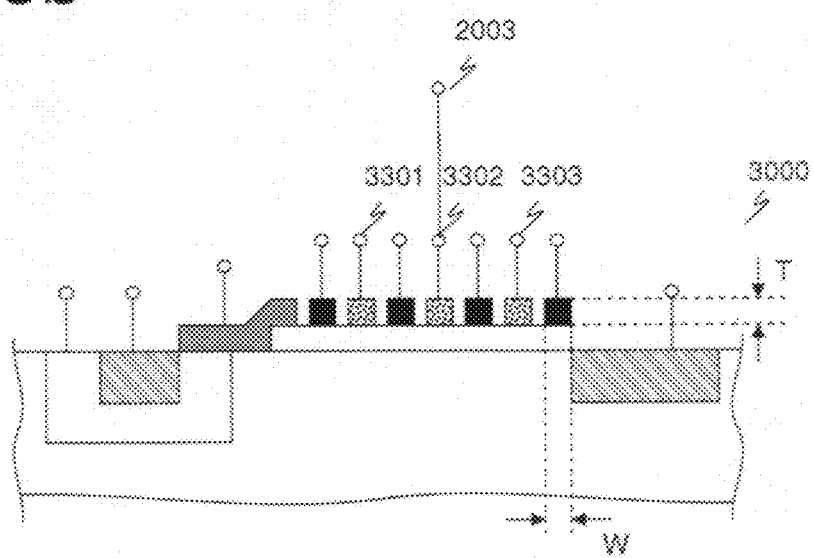

FIGS. 3a and 3b illustrate an alternative semiconductor structure. More specifically, semiconductor structure 3000 of FIGS. 3a and 3b differs from semiconductor structure 1000 of Figures 1a and 1b due to the presence of a further spirally shaped voltage dropping element 3300 spirally concentrically with voltage dropping element 1200 of FIGS. 1a and 1b.

The connection of the two ends of voltage dropping element 3300 is similarly to those of voltage dropping element 1200. In this manner, the two voltage dropping elements 1200 and 3300 act as a voltage dropping means.

The figures do not illustrate the connection of the gate 1103 to any of the voltage dropping element 1200 or 3300 for ease of understanding of the drawings. It is nevertheless understood that a connection equivalent to connection 4001 can be realized between any of voltage dropping elements 1200 and 3300 and the gate 1103.

The placement of two voltage dropping elements 1200 and 3300 allows more flexibility. For instance, while voltage dropping element 1200 could be a resistance, voltage dropping element 3300 could be a series of diodes, and viceversa. Moreover, as can be seen in FIG. 3b, external connection 2003 could be connected to any intermediate point of voltage dropping element 1200 such as intermediate points, 1202 and 1203. However, external connection 2003 could also be connected to intermediate point 3302, and others not shown, of voltage dropping element 3300.

Additionally, the placement of two voltage dropping elements 1200 and 3300 may be advantageous in the case where, for instance, the circuit designer requires a low current for the control of gate 1103 but requires a higher current for the control of second semiconductor chip 6002. In such a case, for instance when using resistors for the voltage dropping elements 1200 and 3300, it would be advantageous to realize a higher resistance value for voltage dropping 1200, connected to gate 1103, and a lower resistance value for voltage dropping element 3300, connected to second semiconductor chip 6002. More generally, having two or more voltage dropping elements allows the simultaneous generation of multiple levels of current and/or voltage. This provides flexibility in the currents and/or voltages that can be employed within and outside of the semiconductor structure.

As discussed above, voltage dropping element 1200 could have a certain length, width and thickness. Those values could be similar for voltage dropping element 3300, or they could be different. Particularly, while length of the two voltage dropping elements may be in a similar range, due to the concentrically spiral design, the thickness and the width may change from one voltage dropping element to the other. Additionally, the position of the intermediate contact points could change from one voltage dropping element to the other, in order to define resistances as needed.

Moreover, thickness and width of the voltage dropping elements 1200 and 3300 can be constant for their entire length. On the other hand, if the voltage dropping element 1200 and/or 3300 is realized as a spiral, the thickness and/or width and/or length of each spire can be varied to obtain desired effects. For instance, in the case of FIGS. 1a, 1b, 2a and 2b, where intermediate points 1202, 1203 and 3302 are located on a straight line A-A', it could be useful to compensate for the different lengths of the different spires, such that the voltage drop between end point 1204 and intermediate point 1203 may be equal to the voltage drop between intermediate points 1203 and 1202 and so on. For instance, in the case of use a resistor for one of the voltage dropping elements 1200 and 3300, this could be achieved by appropriately increasing the thickness and/or height of the voltage dropping element going from end point 1204 to end point 1201, so as to realize a smaller specific resistance along the length of the spiral in a manner so as to compensate for the longer length of the each spire.

Although embodiments have been described with reference to a circular design for the high voltage transistor 1100 and for the voltage dropping elements 1200 and 3300, embodiments are not so limited. Alternatively, a squared design for the high voltage transistor 1100 and/or a squared spiral voltage dropping means 1200 could be used. More generally, any geometry for the high voltage transistor 1100 and for the voltage dropping elements 1200 and 3300 could be employed as long as it allows the connection of at least one intermediate point of the voltage dropping elements 1200 and/or 3300 to be propagated outside of the semiconductor chip including the semiconductor structure.

Moreover, although embodiments have been described with reference only one external connection 2003, it is to be understood that embodiments are not limited thereto. As an alternative, any number of external connections could be realized, so as to provide different voltage values and/or different current values.

Although embodiments have been described with reference to only one or two voltage dropping elements 1200 and 3300 forming the voltage dropping means, embodiments are not limited thereto. As an alternative, any number of voltage dropping elements could be comprised in various embodiments. This provides the beneficial advantage that any desired current value could be provided.

Furthermore, the usage of different voltage dropping elements could be advantageous in case the impedance provided by the voltage dropping element has to be adapted to a certain input impedance of second semiconductor circuit 6002.

Additionally, the choice of multiple voltage dropping elements could be done based on the average and/or maximum current that they have to provide. For instance, in the case of a resistive voltage dropping element, the resistance could be the same with a certain combination of length, width and thickness. However, this resistance may also be obtained, for instance, with a longer length and a wider width and/or thickness. This could be advantageous in case a higher current has to be driven by the voltage dropping element.

The Figures do not include elements such as a gate oxide, STI, pocket implants and so on, for ease of understanding of the drawings. It is nevertheless understood that the person skilled in the art would know how to design and realize such features within various embodiments.

In a case that the voltage dropping element 1200 and/or 3300 is realized by a series of diodes, such design could be a simple series of reverse-polarized diodes, a series of back-to-back diodes and/or a series of back-to-back diodes as described in Italian Patent Application number VI2011A000246 which is incorporated herein by reference.

Furthermore, although external connection 2003 has been described as a connection to outside of the chip and/or package including the semiconductor structure, embodiments are not limited to this. For instance, a plurality of semiconductor structures, at least one of which being the semiconductor structure in accordance with various embodiments, could be realized with a single package. In such a case, the external connection 2003 could be connected to any other semiconductor structure in the same package and/or chip. Still alternatively, a semiconductor substrate may contain a plurality of semiconductor structures, at least one of which being the semiconductor structure in accordance with various embodiments. In such a case, the external connection 2003 could be connected to any other semiconductor structure in the same substrate.

Additionally, although the intermediate points 1202, 1203 and 3302 have been described along line A-A', this has been done only for allowing an easier understanding of the drawings and the various embodiments are not limited to this. More specifically, the intermediate points could be placed on any point of the voltage dropping elements.

Moreover, although some of the above embodiments have been described and illustrated with a connection 4001 between the gate 1103 and the voltage dropping elements 1200 and/or 3300, the embodiments are not limited to this configuration. More specifically, the voltage dropping element 2200 and/or 3300 could be connected only at their two ends to the high voltage terminal 6003 and to the ground terminal 6004, or, more generally, to a voltage lower than the high voltage terminal 6003. In other words, the connection between the gate and the voltage dropping element(s) is not necessary.

Additionally, more generally, any node of the voltage dropping element 1200 and/or 3300 could be connected to any element of the transistor. For instance, intermediate point 1202 and/or 1203 and/or 3302 could be connected to the drain and/or body and/or gate and/or source of the transistor. Also, for instance, the ends of the voltage dropping element 1200 and/or 3300 could be connected one to the drain and one to the body of the transistor. In particular, the voltage dropping element 1200 and/or 3300 are such that they can provide an electrostatic protection to the transistor even if none of their node is connected to the transistor, but only thanks to their placement in the neighbourhood of the transistor, so as to impose a fixed boundary condition.

Additionally, although the embodiments have has been described with reference to a common connection between the ends of voltage dropping element 1200 and/or 3300, the source 1101 of transistor 1100 and the ground terminal 6004, embodiments are not limited to this. Alternatively, or in addition, the source 1101 could be connected to the ground terminal or, more generally, a first low voltage terminal, one end of the voltage dropping element 1200 and/or 3300 could be connected to the ground terminal or, more generally, a second low voltage terminal. In this case, both the first and second low voltage values could be lower than the high voltage value of high voltage terminal 6003. Alternatively, or in addition, the connection of the source and/or the end of the voltage dropping element 1200 and/or 3300 to the ground terminal could be done though any number of additional elements. For instance via a resistor and/or a transistor, etc.

Similarly, the drain 1104 and the other end of voltage dropping element 1200 and/or 3300 do not necessarily share a common connection to the high voltage terminal 6003. Alternatively, or in addition, those two elements could be connected independently to the high voltage terminal 6003. Alternatively, or in addition, the connection of each of those two elements to the high voltage terminal could be done though any number of additional elements. For instance, via a resistor and/or a diode and/or a transistor, etc.

Furthermore, although the voltage dropping element 1200 and/or 3300 have been described as, among other options, a resistance, this does not imply that they are each a single resistance, but they could be each, for instance, two or more resistances connected in series. For instance, voltage dropping element 1200 could be realized by a single strip of resistance arranged as a spiral. Alternatively, or in addition, voltage dropping element could be realized as two or more resistances in series, for instance connected via one or more metallic strips. This could be advantageous, for instance, if connection to a metallic strip would be easier than connection to the resistance strip. For instance, the metallic strip(s) may be placed in correspondence with the desired intermediate point(s).

Summarizing, it is the particular approach of various embodiments to provide a connection to a voltage dropping means within a semiconductor structure for allowing a voltage, the value of which is based on the configuration of the voltage dropping means, to be used outside of the semiconductor structure. In particular, the semiconductor structure may comprise a high voltage transistor and the voltage dropping means, wherein the voltage dropping means may be used to protect the high voltage transistor from the high voltage value. This solution is particularly advantageous since the voltage dropping means would then act both to protect the transistor and to provide a voltage value outside of the semiconductor structure.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor structure comprising:
   a high-voltage transistor including a high voltage terminal;
   at least one voltage dropping element, at least part of which is overlapping the high-voltage transistor;
   at least one intermediate contact point to the at least one voltage dropping element, connected to at least one intermediate position between a first end and a second end of the at least one voltage dropping element; and
   at least one external connection connecting the at least one intermediate contact point to an outside of the semiconductor structure,
   wherein the at least one voltage dropping element comprises:
      a first spirally shaped voltage dropping element connected between the first end and the high voltage terminal; and
      a second spirally shaped voltage dropping element connected between the high voltage terminal and the second end,
      wherein the first and second spirally shaped voltage dropping elements are connected in series to each other at the high voltage terminal and spiral concentrically outwardly from the high-voltage terminal.

2. The semiconductor structure of claim 1, wherein any of the first and/or second voltage dropping element has a transverse section having a constant value or having a value compensating for different lengths of the first and second spirally shaped voltage dropping elements.

3. The semiconductor structure of claim 2, wherein one of the first end and second end of the first and second spirally shaped voltage dropping elements is connected to a source of the high-voltage transistor.

4. The semiconductor structure of claim 1, wherein a gate of the high-voltage transistor is connected to the at least one intermediate contact point.

5. The semiconductor structure of claim 1, wherein the at least one voltage dropping element comprises at least one resistor.

6. The semiconductor structure of claim 5, wherein the at least one resistor comprises one of polysilicon and polysilicon doped with a dopant selected from the group consisting of phosphorus and boron and arsenic.

7. The semiconductor structure of claim 5, wherein the at least one resistor has a resistance value in the range of $10k\Omega$-$1G\Omega$.

8. The semiconductor structure of claim 1, wherein the at least one voltage dropping element comprises at least one series of diodes.

9. The semiconductor structure of claim 8, wherein the at least one series of diodes comprises a plurality of reverse-biased diodes.

10. The semiconductor structure of claim 8, wherein the at least one series of diodes comprises a plurality of back-to-back diodes.

11. The semiconductor structure of claim 1, wherein the at least one voltage dropping element overlaps a drift region of the high-voltage transistor.

12. The semiconductor structure of claim 1, wherein the at least one voltage dropping element and the high-voltage transistor are separated by an insulation layer.

13. A circuit board comprising the semiconductor structure according to claim 1, and a second semiconductor chip, wherein the circuit board is configured so that at least the second semiconductor chip uses the semiconductor structure as a voltage divider.

14. The semiconductor structure of claim 1, wherein the first and second spirally shaped voltage dropping elements have different characteristics.

15. The semiconductor structure of claim 1, wherein the first and second spirally shaped voltage dropping elements have different resistances.

16. The semiconductor structure of claim 1, wherein the first and second spirally shaped voltage dropping elements have different lengths, widths and/or thicknesses.

17. The semiconductor structure of claim 1, wherein the at least one intermediate contact point comprises a first intermediate contact point to the first spirally shaped voltage dropping element and a second intermediate contact point to the second spirally shaped voltage dropping element.

18. The semiconductor structure of claim 17, wherein intermediate positions of the first intermediate contact point and the second intermediate contact point are different.

* * * * *